United States Patent
Lai et al.

(10) Patent No.: US 10,096,544 B2
(45) Date of Patent: Oct. 9, 2018

(54) SEMICONDUCTOR INTERCONNECT STRUCTURE

(75) Inventors: Chih-Ming Lai, Hsinchu (TW); Wen-Chun Huang, Tainan (TW); Ru-Gun Liu, Zhubei (TW); Pi-Tsung Chen, Zhubei (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 505 days.

(21) Appl. No.: 13/464,055

(22) Filed: May 4, 2012

(65) Prior Publication Data
US 2013/0292841 A1 Nov. 7, 2013

(51) Int. Cl.
| H01L 31/00 | (2006.01) |
| H01L 23/48 | (2006.01) |
| H01L 23/52 | (2006.01) |
| H01L 29/40 | (2006.01) |
| H01L 23/522 | (2006.01) |
| H01L 23/528 | (2006.01) |
| H01L 23/532 | (2006.01) |
| H01L 21/768 | (2006.01) |

(52) U.S. Cl.
CPC .... *H01L 23/5226* (2013.01); *H01L 21/76816* (2013.01); *H01L 23/5283* (2013.01); *H01L 23/5329* (2013.01); *H01L 23/53295* (2013.01); *H01L 2924/0002* (2013.01)

(58) Field of Classification Search
CPC ....... H01L 21/768; H01L 21/28; H01L 23/48; H01L 23/522; H01L 23/5226; H01L 23/5283; H01L 23/5329; H01L 23/53295

USPC .......................................... 257/774; 438/675
See application file for complete search history.

(56) References Cited

U.S. PATENT DOCUMENTS

| 4,948,755 A * | 8/1990 | Mo ............................... 438/625 |
| 5,739,579 A * | 4/1998 | Chiang et al. ................ 257/635 |
| 6,265,778 B1 * | 7/2001 | Tottori ................ H01L 23/5258 |
| | | 257/529 |
| 6,998,308 B2 * | 2/2006 | Ooi et al. ....................... 438/253 |
| 7,626,829 B2 * | 12/2009 | Watanabe ......... H01L 23/49816 |
| | | 174/255 |
| 2003/0116854 A1* | 6/2003 | Ito et al. ........................ 257/761 |
| 2004/0232557 A1* | 11/2004 | Kim ............................... 257/758 |
| 2005/0167844 A1* | 8/2005 | Ohto ................. H01L 21/76801 |
| | | 257/758 |
| 2007/0096328 A1* | 5/2007 | Takahashi .............. H05K 1/115 |
| | | 257/774 |

(Continued)

*Primary Examiner* — Joseph C Nicely
*Assistant Examiner* — Wilner Jean Baptiste
(74) *Attorney, Agent, or Firm* — Haynes and Boone, LLP

(57) ABSTRACT

The present disclosure provides an interconnect structure for a semiconductor device. The interconnect structure includes a first metal layer that contains a first metal line. The interconnect structure includes a dielectric layer located over the first metal layer. The dielectric layer contains a first sub-via electrically coupled to the first metal line and a second sub-via electrically coupled to the first sub-via. The second sub-via is different from the first sub-via. The interconnect structure includes a second metal layer located over the dielectric layer. The second metal layer contains a second metal line electrically coupled to the second sub-via. No other metal layer is located between the first metal layer and the second metal layer.

20 Claims, 14 Drawing Sheets

(56) References Cited

U.S. PATENT DOCUMENTS

2008/0107863 A1* 5/2008 Ikeda .................. H01L 21/4857
　　　　　　　　　　　　　　　　　　　428/137
2008/0135957 A1* 6/2008 Liaw et al. .................... 257/421
2010/0308464 A1* 12/2010 Tsutsue et al. ............... 257/758
2011/0254165 A1* 10/2011 Muranaka ......... H01L 21/76832
　　　　　　　　　　　　　　　　　　　257/751

* cited by examiner

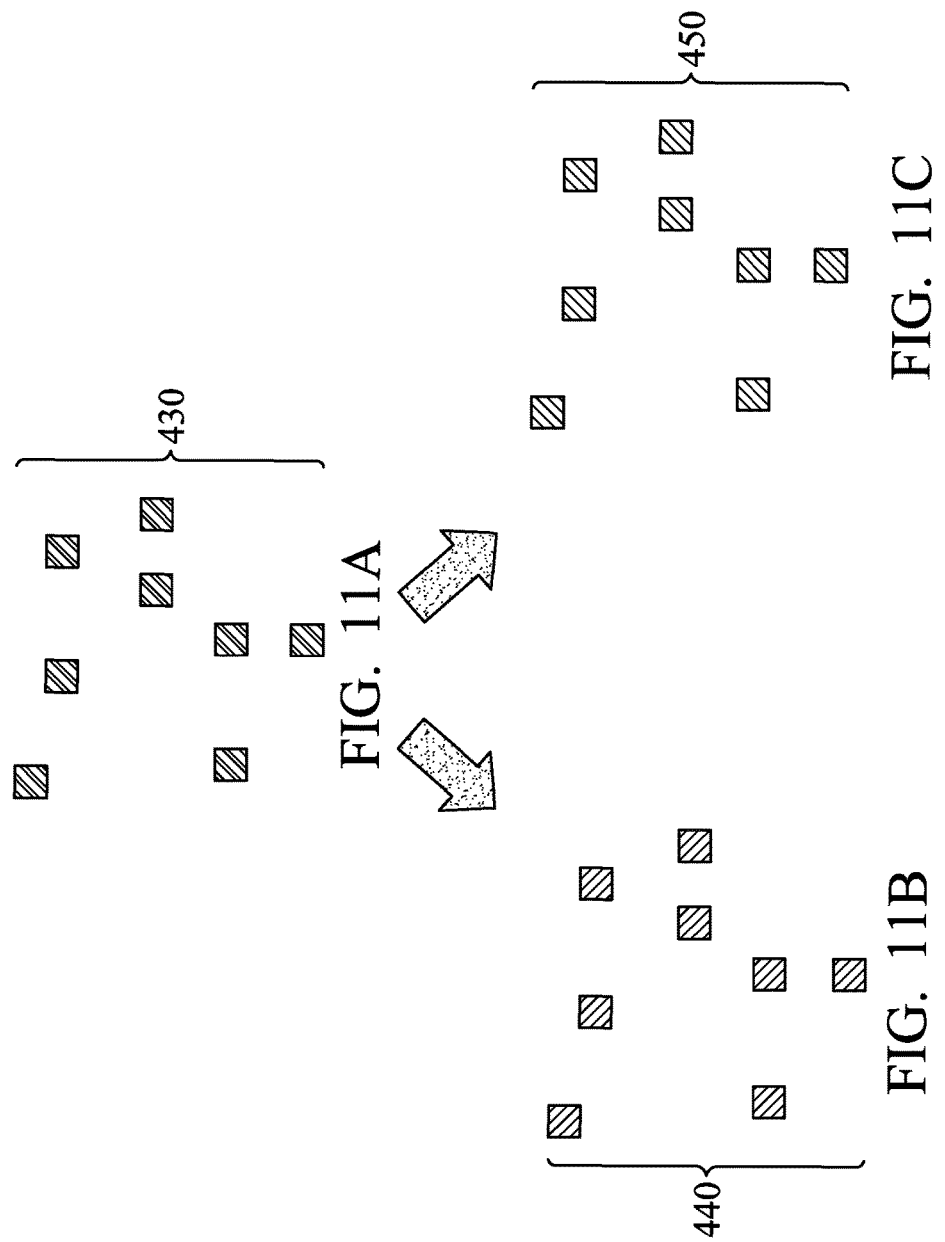

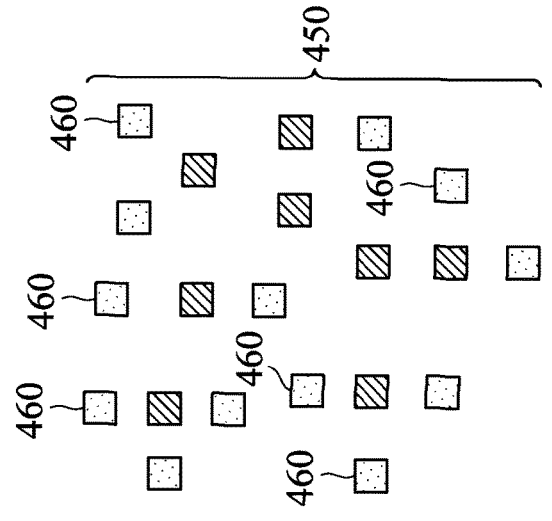
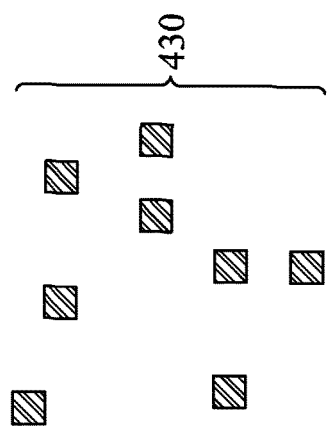
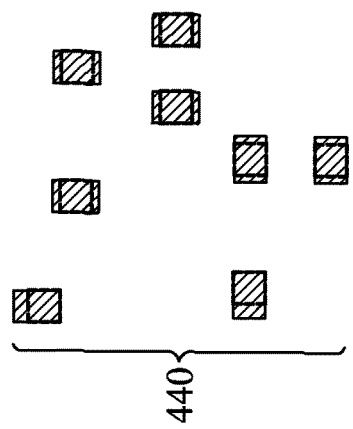

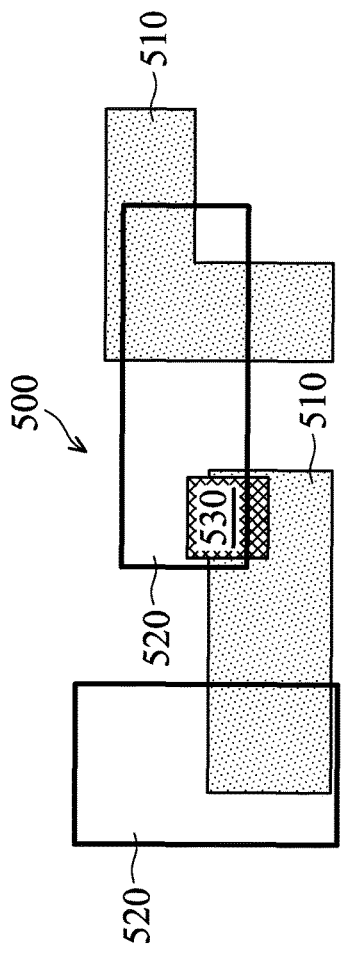
FIG. 13A
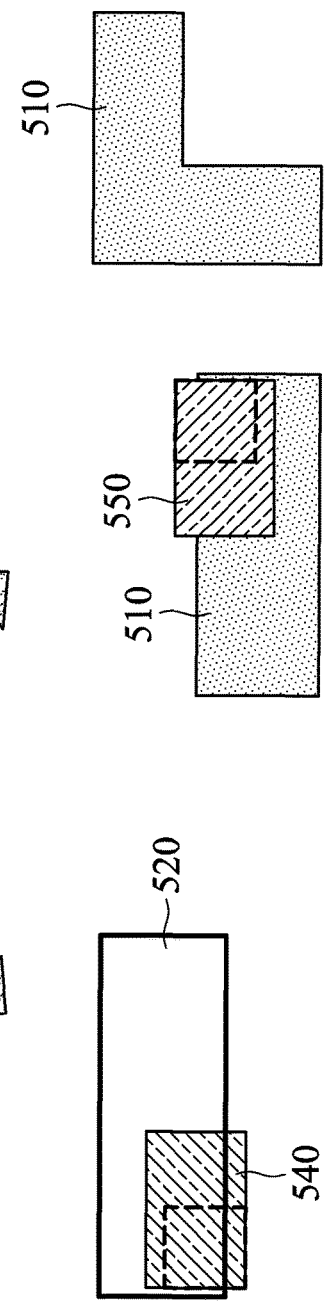
FIG. 13B
FIG. 13C

SEMICONDUCTOR INTERCONNECT STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

As the semiconductor industry progresses into nanometer technology process nodes in pursuit of higher device density, higher performance, and lower costs, challenges from both fabrication and design have resulted in the development of multilayer (or three dimensional) integrated devices. The multilayer devices may include a plurality of interconnect layers each including one or more conductive lines which are interconnected to conductive lines from other interconnect layers through vias. However, as the scaling down continues, vias become smaller and smaller, as do the conductive lines. Thus, forming and aligning the vias to their intended conductive lines from different interconnect layers has become more challenging.

Accordingly, although existing multilayer devices and methods of fabricating multilayer devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 10-13 are diagrammatic fragmentary top views of a semiconductor device in accordance with various aspects of the present disclosure.

DETAILED DESCRIPTION

Figure 1:
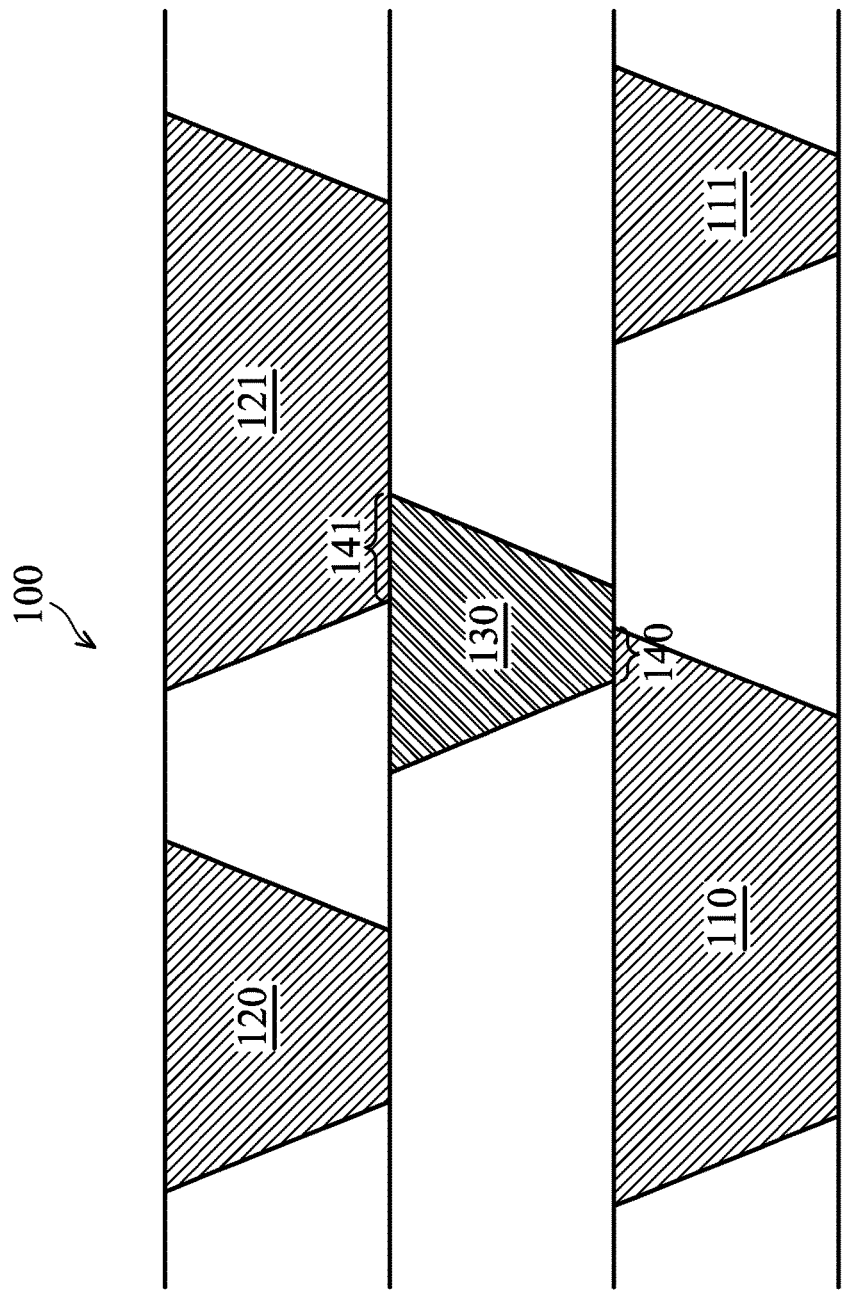
FIGS. 1-9 are diagrammatic fragmentary cross-sectional side views of a semiconductor device at various stages of fabrication in accordance with various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Modern semiconductor devices may utilize an interconnect structure to perform electrical routing between the various components and features on a semiconductor wafer and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) of the interconnect structure provides isolation between the metal lines.

An interconnect structure may also includes a plurality of vias/contacts that provide electrical connections between the metal lines from different interconnect layers. For example, a via may extend vertically and therefore allows a metal line from the M1 layer to be electrically connected to another metal line from the M2 layer. As semiconductor device fabrication technologies continue to evolve, the sizes of the various features on a semiconductor device become smaller and smaller, including the sizes of the vias and metal lines. This leads to fabrication challenges.

An example illustration of some fabrication challenges is shown in FIG. 1, which is a simplified cross-sectional side view of a portion of an interconnect structure 100. The interconnect structure 100 includes a plurality of metal lines belonging to different interconnect layers. For example, the interconnect structure 100 includes metal lines 110-111 that belong to one interconnect layer, as well as metal lines 120-121 that belong to another interconnect layer. The interconnect structure 100 also includes a via 130 that interconnects the metal lines 110 and 121 together. In other words, the via 130 forms interfaces (also referred to as connection areas) 140 and 141 with the metal lines 110 and 121 and is electrically coupled to the metal lines 110 and 121 through these interfaces 140-141, respectively.

As the device scaling down process continues, the dimensions of the via 130 shrink as well. Consequently, the interfaces 140-141 become smaller. Fabrication process variations may also cause the via 130 to "shift" its position horizontally, thereby making the interfaces 140 or 141 even smaller. At some point, it is possible that one (or both) of the interfaces 140-141 could completely disappear, meaning that the via 130 will no longer be electrically coupled to its intended metal line, thus causing an electrical open condition. This is considered a fabrication defect that may lead to device failures. Even if the interfaces 140-141 do not completely disappear, if they become too small, that may still lead to excessive resistance at the interface.

Some existing techniques have tried to remedy this "small interface/connection area" problem by horizontally enlarging the via 130. In other words, the via 130 is manufactured to be much wider (horizontally) than its original design, so as to ensure a sufficiently large interface 140-141 with the metal lines 110 and 121. However, a drawback to that approach is that it may lead to unintentional electrical shorting. For example, as the via 130 expands in size horizontally, it may come into physical contact with the metal line 120 or the metal line 111, which are not meant to be electrically coupled to the via 130. Hence, an undesirable electrical shorting between the via 130 and the metal lines 120 and 111 may occur as a result of enlarging the via 130. Therefore, an improved interconnect structure that does not suffer from these problems described above continues to be sought.

According to the various aspects of the present disclosure, an interconnect structure containing divided sub-vias is disclosed. The sub-vias collectively constitute an interconnection mechanism that electrically interconnects metal lines from different interconnect layers. Stated differently, the sub-vias collectively serve as a replacement for the conventional single via (e.g., the via 130). The various aspects of such interconnect structure is described in more detail below.

FIGS. 2-9 are diagrammatic fragmentary cross-sectional side views of a semiconductor device 200 (that includes an interconnect structure) at various stages of fabrication in accordance with various aspects of the present disclosure. It is understood that FIGS. 2-9 have been simplified for a better understanding of the inventive concepts of the present disclosure. Accordingly, it should be noted that additional processes may be provided before, during, and after the processes shown in FIGS. 2-9, and that some other processes may only be briefly described herein.

Figure 2:
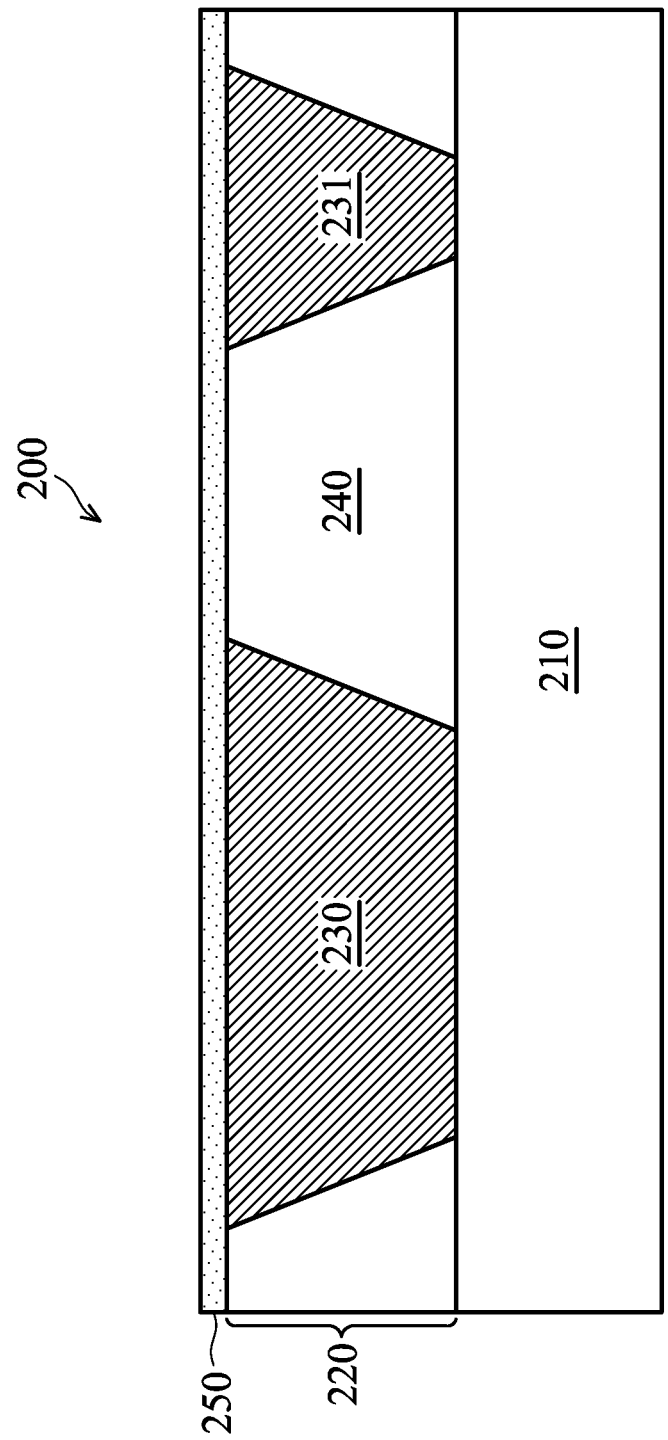

Referring to FIG. 2, the semiconductor device 200 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, fin-shaped field-effect-transistor (FinFET), or other types of transistors. It should be noted that some features of the semiconductor device 200 may be fabricated with a CMOS process flow.

The semiconductor device 200 includes a substrate 210. In the embodiment shown, the substrate 210 is a silicon substrate that is doped with a P-type dopant such as boron. In another embodiment, the substrate 210 is a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate 210 could include an epitaxial layer (epi layer), may be strained for performance enhancement, and may include a silicon-on-insulator (SOI) structure.

Isolation structures are formed in the substrate 210. In some embodiments, the isolation structures include shallow trench isolation (STI) devices. The STI devices contain a dielectric material, which may be silicon oxide, silicon nitride, silicon oxy-nitride, fluoride-doped silicate (FSG), and/or a low-k dielectric material known in the art. The STI devices are formed by etching trenches in the substrate 210 and thereafter filling the trenches with the dielectric material. In other embodiments, deep trench isolation (DTI) devices may also be formed in place of (or in combination with) the STI devices as the isolation structures. Alternatively, other types of isolation structures formed by any type of method now known or later developed may be implemented. For reasons of simplicity, the isolation structures are not specifically herein.

A plurality of microelectronic components is also formed in the substrate. For example, source and drain regions of FET transistor devices may be formed in the substrate 210 by one or more ion implantation and/or diffusion processes. As another example, radiation-sensitive image pixels may be formed in the substrate 210. For reasons of simplicity, these microelectronic components are not specifically illustrated herein either.

An interconnect layer 220 is formed over the substrate 210. The interconnect layer 220 may also be referred to as a conductive layer or a metal layer, since it contains a plurality of metal lines, for example metal lines 230-231. The metal lines 230-231 may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines 230-231 may be formed by a plurality of processes including, but not limited to, etching, physical vapor deposition (PVD), chemical vapor deposition (CVD), sputtering, plating, polishing, etc.

In some embodiments, the metal lines 230-231 each have a trench-like or trapezoidal profile in a cross-sectional view, such as that illustrated in FIG. 2. For example, the top portions of the metal lines 230-231 are wider than their bottom portions. Such shapes may be caused by the fabrication processes used to form the metal lines, for example due to the etching processes. In alternative embodiments, however, the metal lines 230-231 may have other shapes, such as more rectangular profiles in a cross-sectional view.

The interconnect layer 220 also contains a dielectric material 240 (also referred to as an inter-layer dielectric, or ILD) that provides isolation between the metal lines 230-231. The dielectric material 240 may include a dielectric material such as an oxide material. Alternatively, the dielectric material 240 may include silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric material 240 may be formed by any suitable processing including CVD, PVD, sputtering high density plasma CVD (HDP-CVD), spin-on, or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

An etch-stop layer 250 is then formed over the metal lines 230-231 and the dielectric material 240. The etch-stop layer 250 contains a dielectric material, for example an oxide material, a nitride material, an oxynitride material, or another suitable material. The etch-stop layer 250 may be formed by a deposition process known in the art, for example, CVD, PVD, ALD, combinations thereof, or another suitable process.

Figure 3:
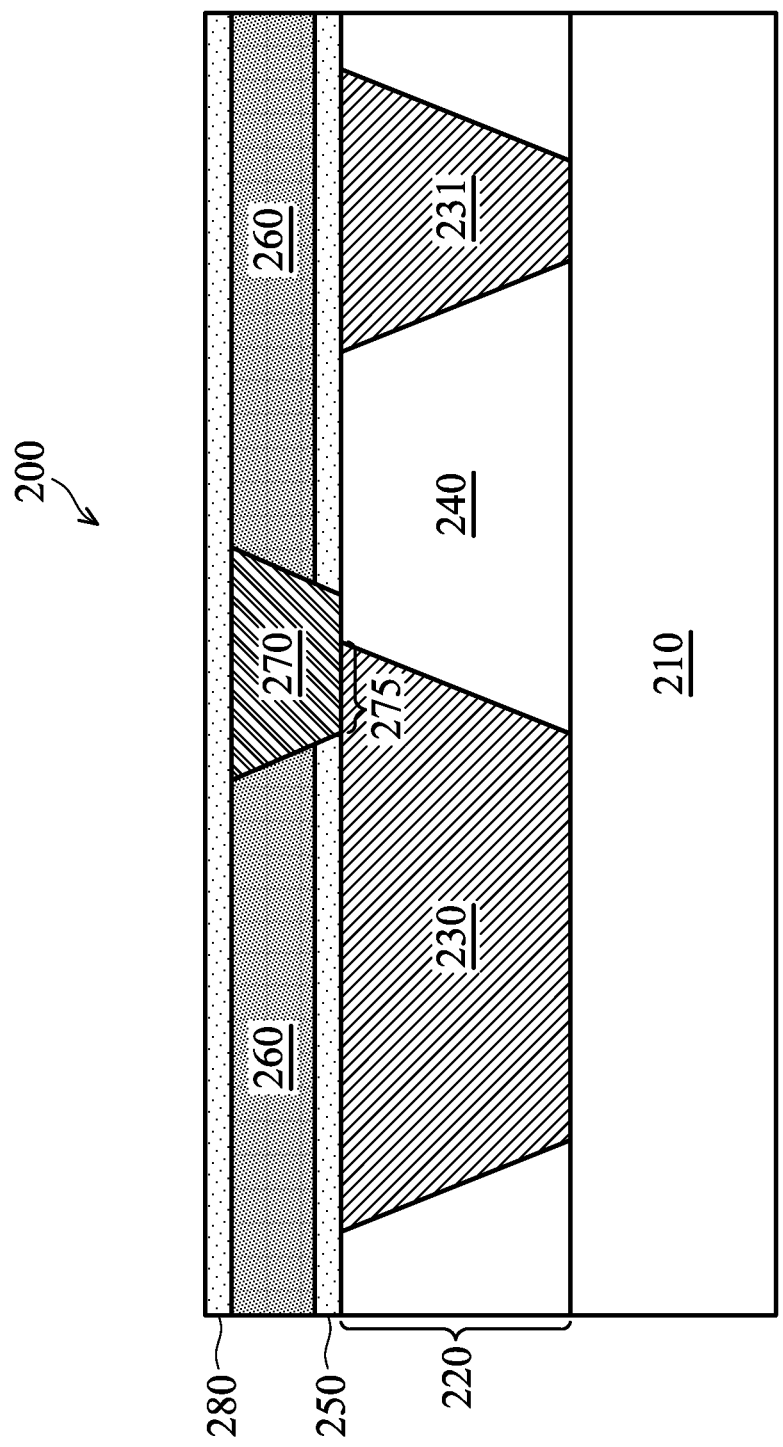

Referring now to FIG. 3, a dielectric layer 260 is formed over the etch-stop layer 250. The dielectric layer 260 contains a dielectric material different from the material of the etch-stop layer 250. The dielectric layer 260 may also be formed by a deposition process known in the art, for example, CVD, PVD, ALD, combinations thereof, or another suitable process.

A plurality of vias is formed in the dielectric layer 260. For the sake of providing an example, a via 270 is illustrated herein. The via 270 is formed by etching an opening in the dielectric layer 260 (and the layer 250) and thereafter filling the opening with a conductive material such as metal. For example, the conductive material may include Tungsten. The via 270 may also have a trench-like trapezoidal profile in a cross-sectional view similar to the shapes of the metal lines 230-231 in some embodiments. The via 270 may also have other shapes, such as more rectangular profiles in a cross-sectional view, in alternative embodiments. The via 270 is electrically coupled to the metal line 230. For example, as shown in FIG. 3, at least a portion of the bottom surface of the via 270 comes into physical contact with at least a portion of the top surface of the metal line 230, thereby forming an interface 275.

After the via 270 is formed, its upper surface is planarized with the dielectric layer 260 by a suitable polishing process (for example a chemical-mechanical-polishing (CMP) process). Thereafter, an etch-stop layer 280 is formed on the planarized surfaces of the via 270 and the dielectric layer 260. The etch-stop layer 280 is optional and may or may not be formed in other embodiments.

Figure 4:
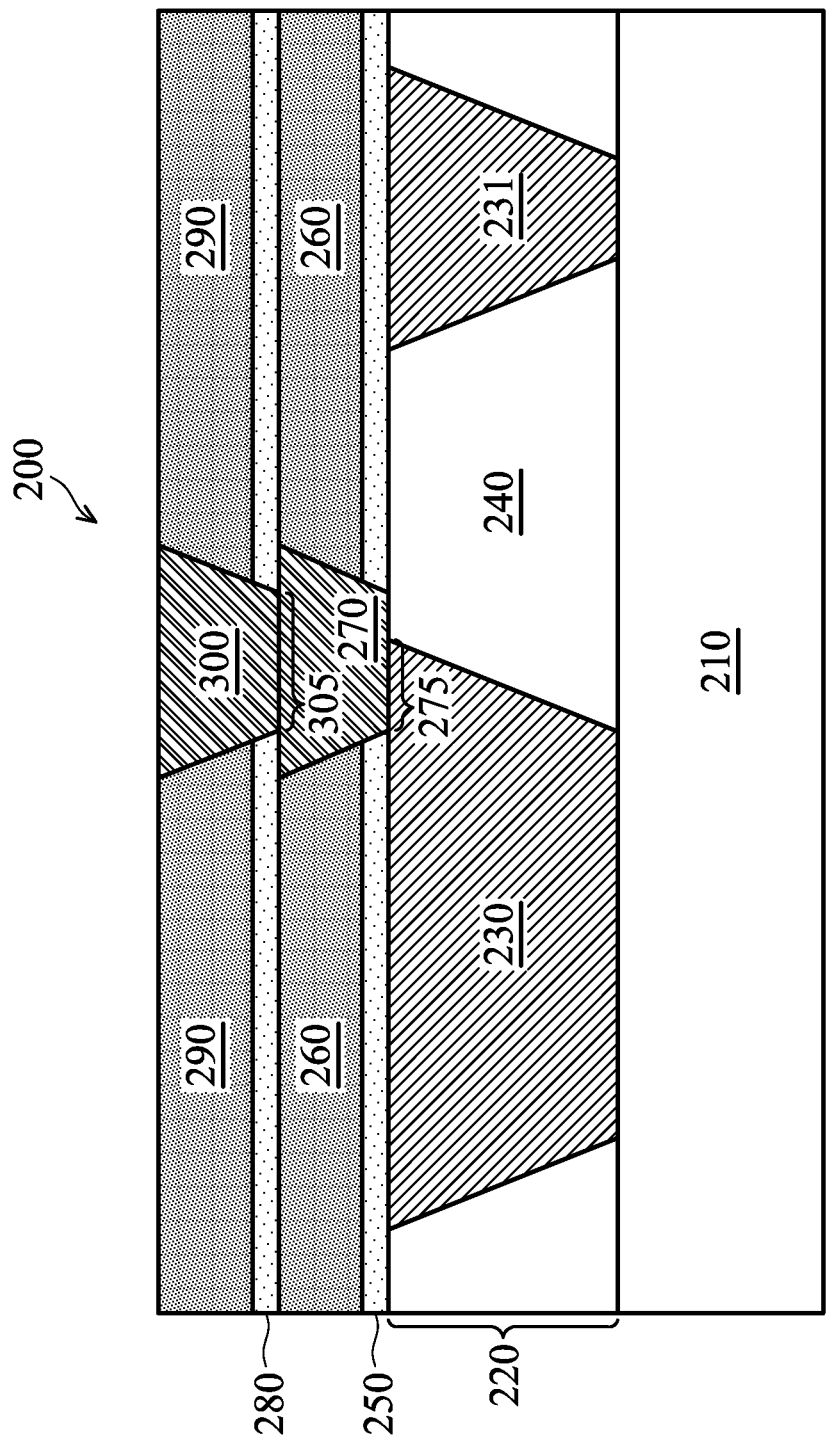

Referring now to FIG. 4, a dielectric layer 290 is formed over the etch-stop layer 280. The dielectric layer 290 contains a dielectric material different from the material of the etch-stop layer 280. The dielectric layer 290 may also be formed by a deposition process known in the art, for example, CVD, PVD, ALD, combinations thereof, or another suitable process.

A plurality of vias is formed in the dielectric layer 260. For the sake of providing an example, a via 300 is illustrated herein. The via 300 is formed by etching an opening in the dielectric layer 290 (and the layer 280) and thereafter filling the opening with a conductive material such as metal. For example, the conductive material may include Tungsten. The via 300 may also have a trench-like trapezoidal profile in a cross-sectional view similar to the shapes of the metal lines 230-231 in some embodiments. The via 300 may also have other shapes, such as more rectangular profiles in a cross-sectional view, in alternative embodiments.

In the embodiment shown in FIG. 4, the via 300 is substantially vertically aligned with and electrically coupled to the via 270. For example, at least a portion of the bottom surface of the via 300 comes into physical contact with at least a portion of the top surface of the via 270, thereby forming an interface 305. In this manner, the via 300 is also electrically coupled to the metal line 230 (through the via 270). The interface 305 may be surrounded or encircled by the etch-stop layer 280.

Figure 5:
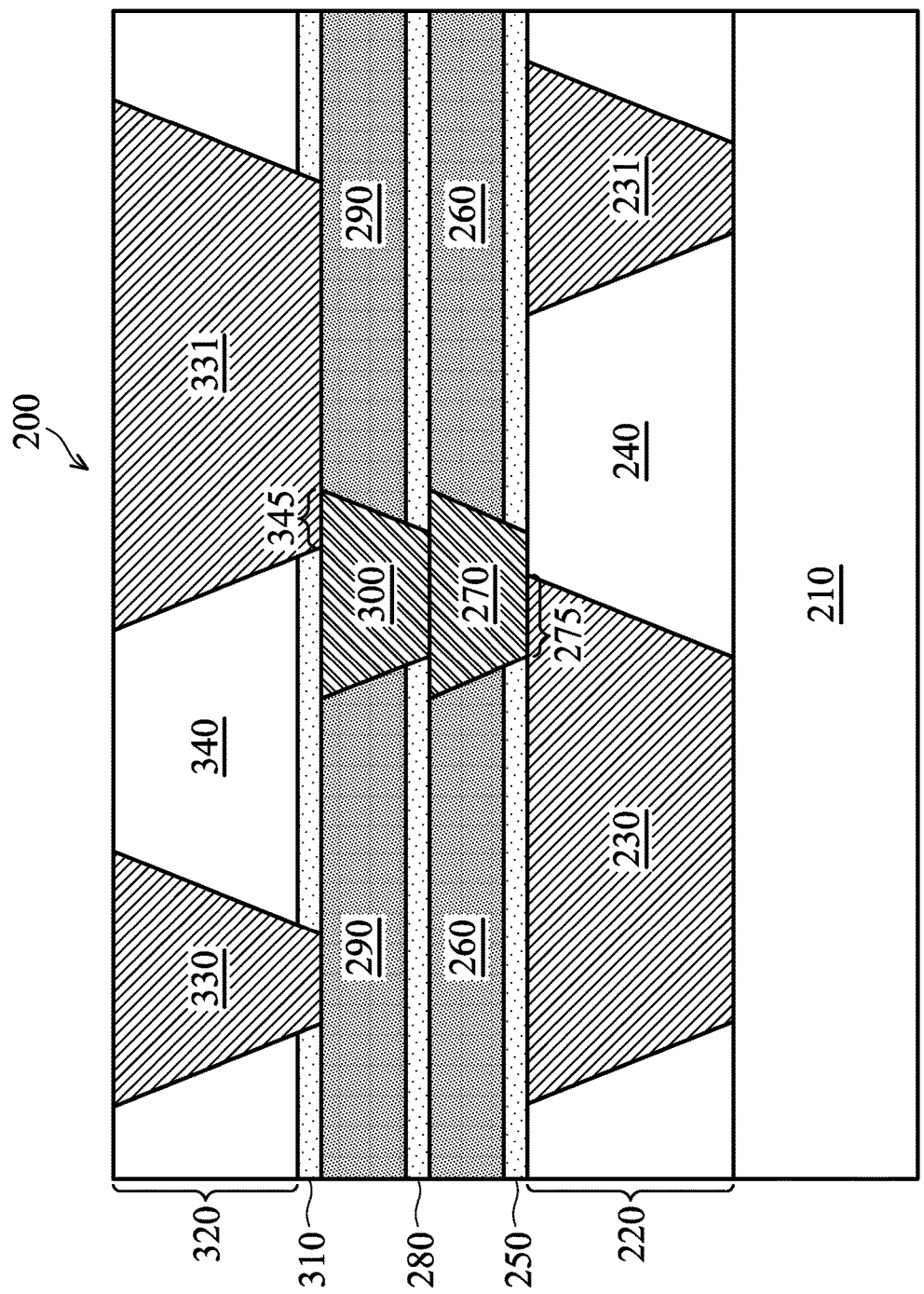

Referring now to FIG. 5, the upper surfaces of the via 300 and the dielectric layer 290 are planarized by a suitable polishing process. Thereafter, an etch-stop layer 310 is formed on the planarized surfaces of the via 300 and the dielectric layer 290.

An interconnect layer 320 is formed over the substrate 210. The interconnect layer 320 may also be referred to as a conductive layer or a metal layer, since it contains a plurality of metal lines, for example metal lines 330-331. The metal lines 330-331 may have material compositions similar to those of the metal lines 230-231 and may be formed using similar fabrication processes. In some embodiments, the metal lines 330-331 each have a trench-like or trapezoidal profile in a cross-sectional view similar to those of the metal lines 230-231. The metal lines 330-331 may also have other shapes, such as more rectangular profiles in a cross-sectional view, in alternative embodiments. The interconnect layer 320 also contains a dielectric material 340 that surrounds the metal lines 330-331.

The metal line 331 is electrically coupled to the via 300. For example, at least a portion of the bottom surface of the metal line 331 is in physical contact with at least a portion of the top surface of the via 300, thereby forming an interface 345. Through the vias 300 and 270, the metal lines 230 and 331 are electrically coupled together. This may not have been possible with conventional interconnect schemes. In more detail, conventional interconnect structures use a single via to connect metal lines from adjacent interconnect layers (for example metal lines from an M−1 layer and an M−2 layer). If two target metal lines are horizontally offset from each other—such as the case of the metal lines 230 and 331—then a single via may or may not be able to achieve sufficient connection area with one or both of the metal lines. If such via "misses" either of the target metal lines, then an electrical open condition would be created, which may be a device defect. Even if the via does not completely "miss" the target metal lines, the actual connection area may still be quite small (especially as device scaling continues), thereby resulting in an undesirable high resistance at the connection area. In addition, if the via is made wider so as to enlarge the connection area, there is a risk that the via may electrically short other unintended metal lines, which would also be considered defects.

In comparison, the present disclosure utilizes two vias (or sub-vias) to perform the electrical coupling between metal lines from adjacent interconnect layers. For example, the vias 270 and 300 may each be considered a sub-via (and are thereafter referred to as a sub-via), and the electrical coupling between the metal lines 230 and 331 (from adjacent interconnect layers 220 and 320) is carried out by the sub-vias 270 and 300 collectively. One benefit of this sub-via approach relates to the fact that each sub-via 270 or 300 has a smaller thickness or vertical depth compared to a traditional single via. Thus, the sub-vias 270 or 300 may have an aspect ratio—defined as a ratio between the via thickness and the via width—that is easier to achieve, since the width of the sub-vias 270 and 300 may remain the same as the conventional single via. In other words, the vias 270 and 300 may be easier to fabricate than the traditional vias.

In addition, in situations where the shapes of the traditional vias and the sub-vias 270 and 300 herein are trapezoidal, the bottom of the via would get increasingly small as the vertical depth or thickness increases. Thus, for a traditional single via, its bottom surface may be quite small, and thus the connection area between that via and the target metal line therebelow may be small too, thereby leading to difficulties in making the connection and/or an excessively high resistance at the connection area. Here, since the sub-via 270 is thinner than the traditional single via (for example the sub-via 270 may be approximately ½ of the thickness of the traditional single via), the bottom surface of the sub-via 270 is substantially greater than a bottom surface of a traditional via. In other words, the connection area or the interface 275 between the via 270 and the metal line 230 can be substantially greater than what would have been possible had a traditional single via been used.

Figure 6:
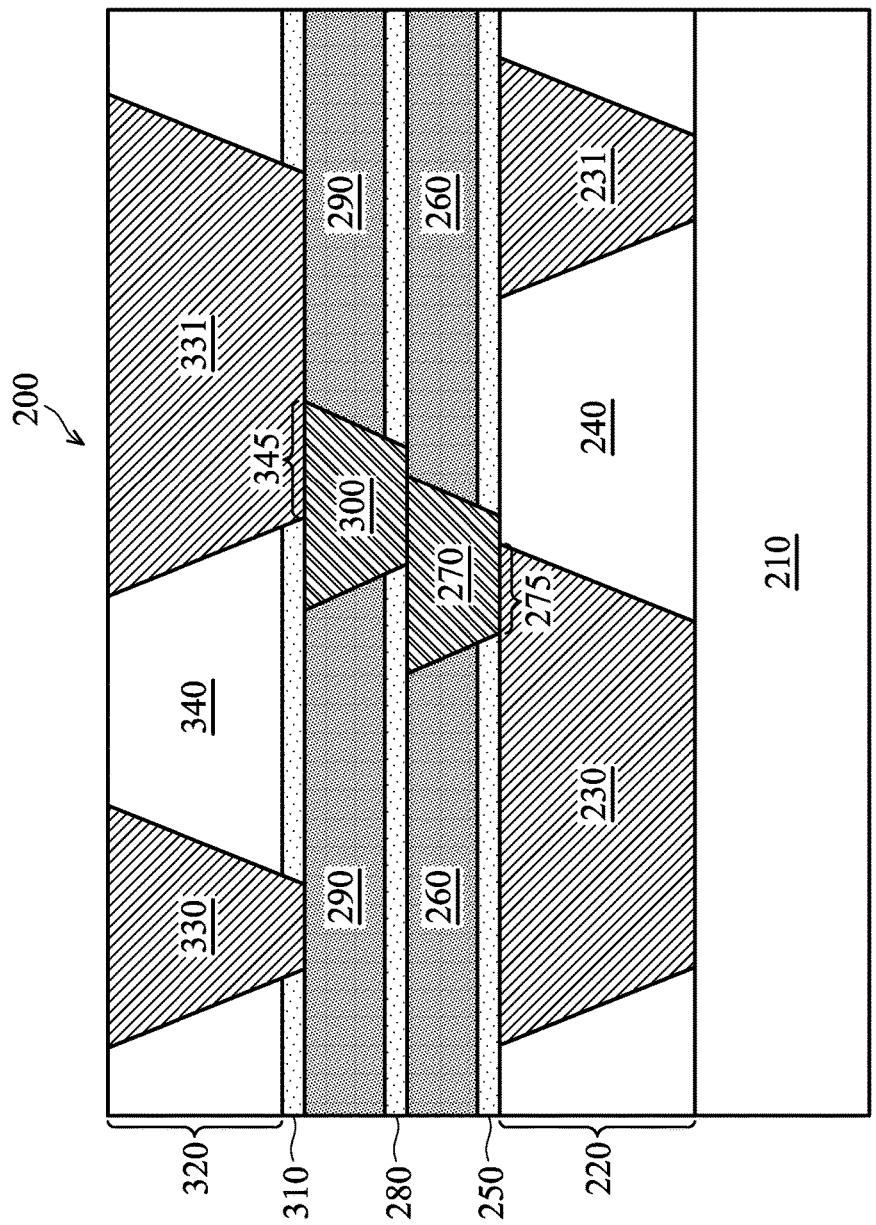

FIG. 6 shows another embodiment of an interconnect structure that utilizes two sub-vias 270 and 300 to electrically interconnect metal lines from different interconnect layers. For reasons of clarity and consistency, similar components are labeled the same throughout FIGS. 2-6.

Referring to FIG. 6, the sub-vias 300 and 270 are not vertically aligned but rather are horizontally shifted or laterally offset from each other. For example, the sub-via 270 is located more to the "left", whereas the sub-via 300 is located more to the "right" of the Figure. This is because the metal line 230 (to which the sub-via 230 is interconnected) is disposed to the left of the metal line 331 (to which the sub-via 300 is interconnected). In other words, the positional displacement between the sub-vias 270 and 300 may be a function of the relative displacement between the metal lines that are interconnected with the sub-vias 270 and 300, respectively. Therefore, the vias 300 and 270 may have other positional configurations in other embodiments, for example they may be offset by different amounts or directions.

In addition to achieving the benefits of the embodiment of FIG. 5 discussed above, the embodiment of FIG. 6 offers even more interconnection flexibility. For example, by shifting the sub-vias 270 and 300, the interfaces 275 and 345 may be enlarged. Stated differently, by shifting the sub-via 270 to the left and shifting the sub-via 300 to the right, the sub-vias 270 and 300 are now making a larger contact area with the metal lines 230 and 331, respectively. This means that resistance at the interfaces 275 and 345 is reduced. The process window also becomes larger, making it easier to ensure the desired electrical interconnections and thus reducing defects. Also, in situations where the metal lines (such as the metal lines 230 and 331) are experiencing severe positional shifts with respect to one another, it may have been previously impossible to electrically interconnect them with a traditional single via or even with positionally aligned sub-vias. However, by shifting the sub-vias in the embodiment shown in FIG. 6, it is now possible to still electrically interconnect these metal lines.

The embodiments discussed above employ two sub-vias (or two layers of sub-vias) to perform the electrical interconnection between metal lines from adjacent interconnect layers. However, it is understood that any other number of sub-vias (or layers of sub-vias) may be used to perform the same tasks in alternative embodiments. For example, three sub-vias (or three layers of sub-vias) may be used in a different embodiment, where each sub-via is stacked on top of another.

Figure 7:
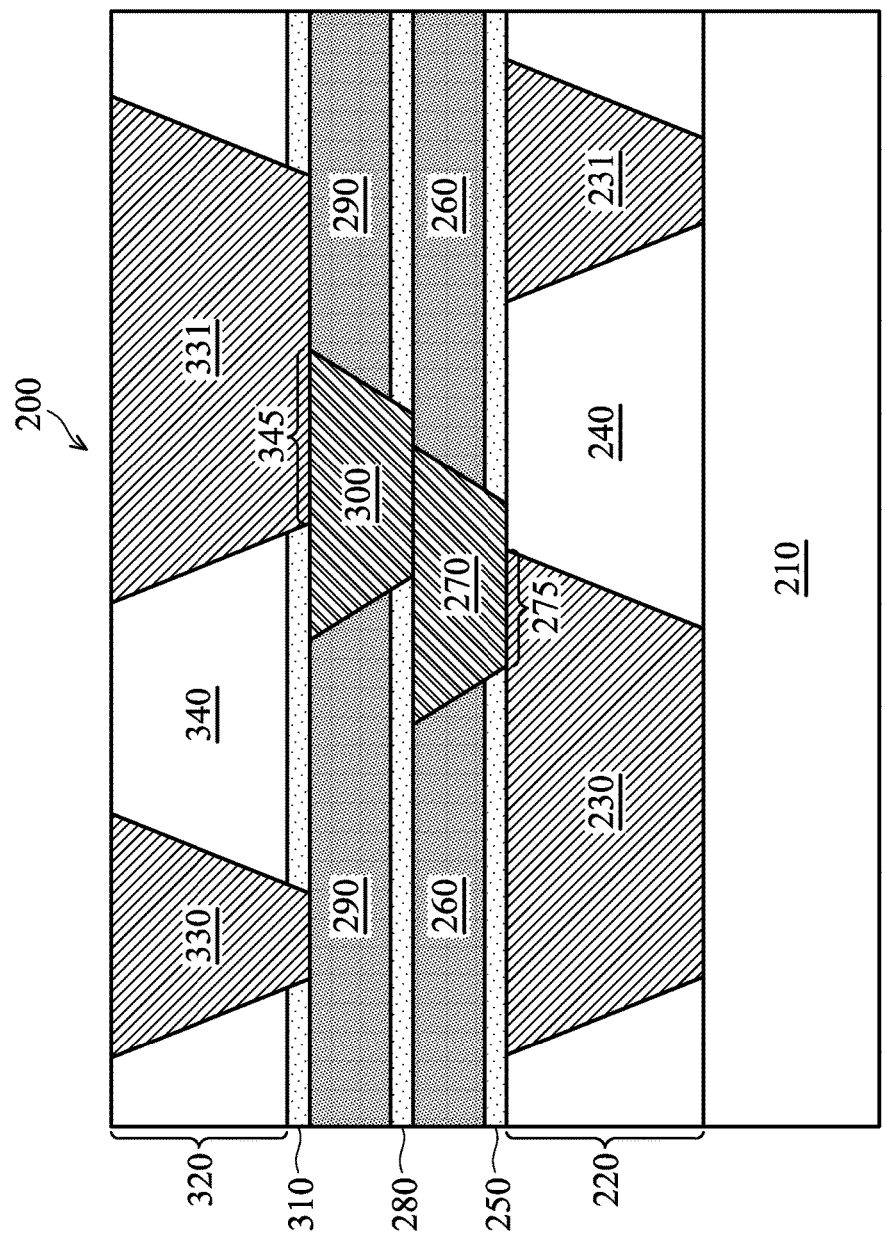

FIG. 7 illustrates another embodiment of the interconnect structure 200. In the embodiment illustrated in FIG. 7, the sub-vias 270 and 300 are reshaped. For example, they are wider than the sub-vias 270 and 300 in the embodiment of FIG. 5 or 6. The sub-vias 270 and 300 in the embodiment of FIG. 7 may also have different geometries from the sub-vias 270 and 300 in the embodiment of FIG. 5 or 6. Consequently, the interfaces 275 and 345 may also be enlarged, thereby making the process window bigger and making the fabrication easier.

The process flow illustrated in FIGS. 2-5 employ a "single damascene" approach to form the sub-via 300 and the interconnect layer 320 thereabove. Alternatively stated, the layer containing the sub-via 300 and the interconnect layer 320 are formed separately and each by a single damascene process. In another embodiment described below, a "dual damascene" approach is used to form the via 300 and the interconnect layer 320 together. This embodiment is discussed below with reference to FIGS. 8-9. Once again, for reasons of consistency and clarity, similar components are labeled the same for these different embodiments.

Figure 8:
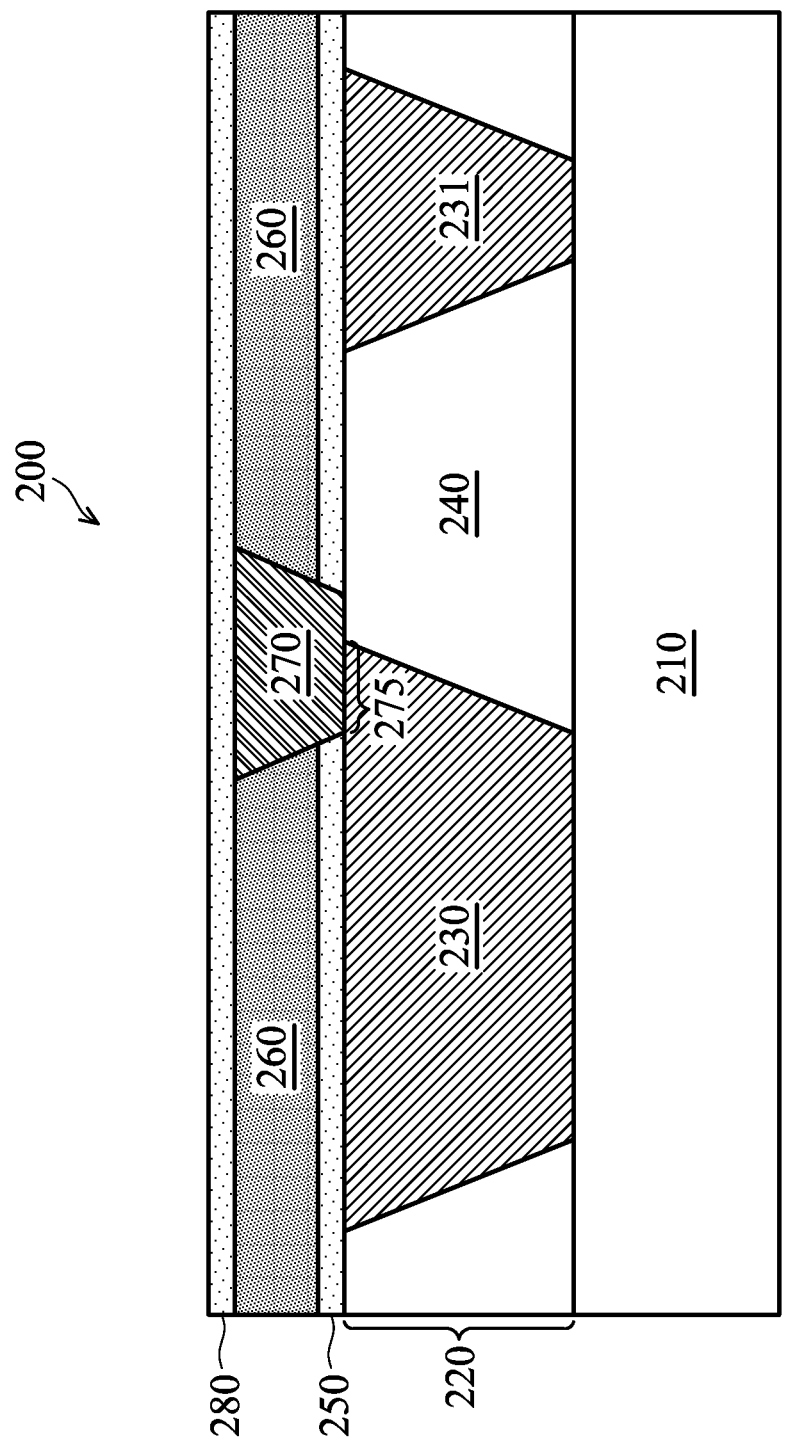

Referring to FIG. 8, the interconnect layer 220 containing the metal lines 230-231 is formed over the substrate 210. The etch-stop layer 250 is formed over the interconnect layer 220. The dielectric layer 260 is formed over the etch-stop layer 250, and the sub-via 270 is formed in the dielectric layer 260. The etch-stop layer 280 is optionally formed over the dielectric layer 260. The processes used to form these components are substantially the same as those discussed above in association with the "single damascene" embodiment of FIGS. 2-5.

Figure 9:
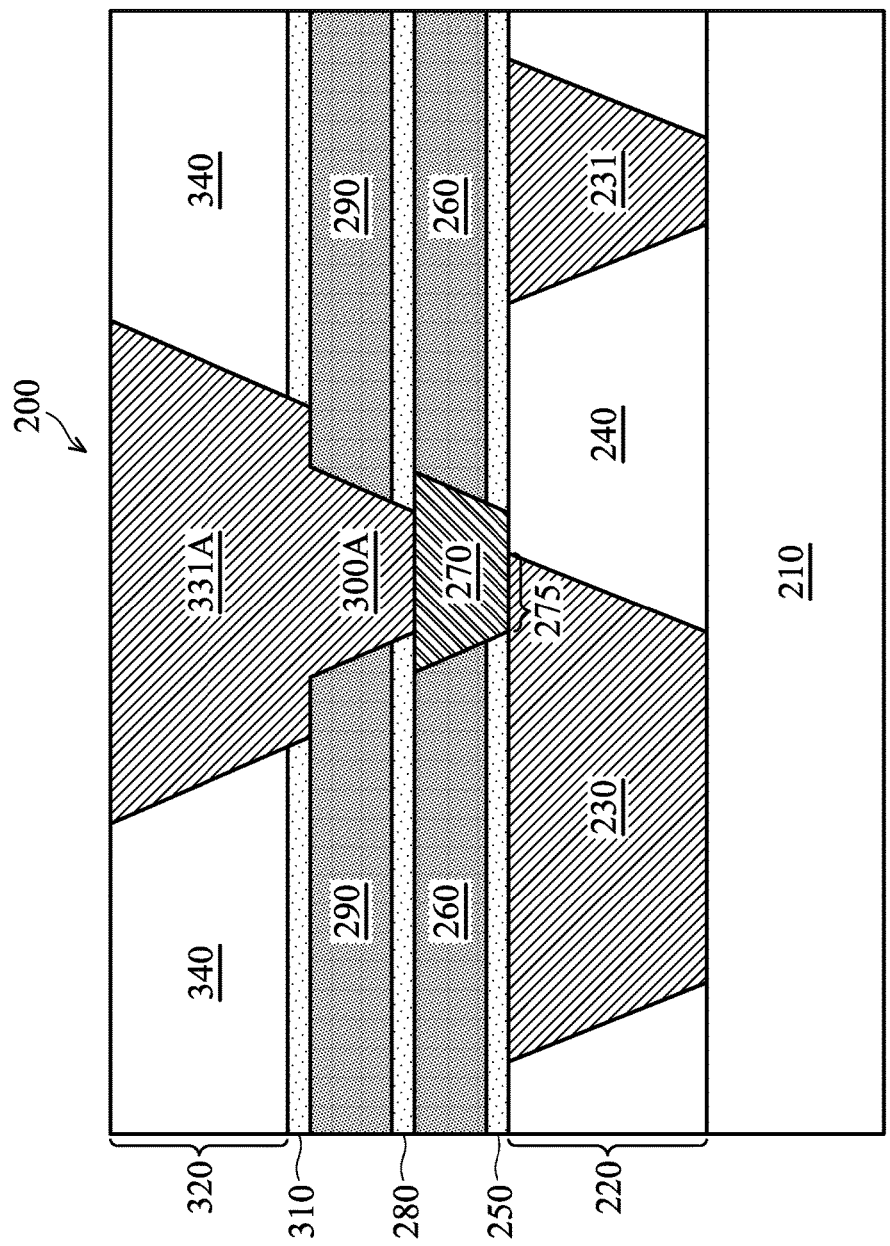

Referring now to FIG. 9, the dielectric layer 290 is formed over the etch-stop layer 280. An etch-stop layer 310 is formed over the dielectric layer 290. The dielectric material 340 of the interconnect layer 320 is then formed over the etch-stop layer 310. Thereafter, a dual damascene process is used to form a sub-via 300A and a metal line 331A together. The dual damascene process involves etching an opening or a trench in both the dielectric layer 290 and the dielectric material 340. Such trench includes a lower portion that is narrower and an upper portion that is wider. The narrower lower portion is disposed in the dielectric layer 290, and the wider upper portion is disposed in the dielectric material 340 of the interconnect layer 320.

Thereafter, a deposition process is performed to fill the trench with a conductive material such as a suitable metal. Consequently, the conductive material filling the lower part of the trench becomes the sub-via 300A, and the conductive material filling the upper part of the trench becomes the metal line 331A. A polishing process may then be performed to remove excess material outside the trench. Thus, the dual damascene process forms a single component that effectively includes both the sub-via 300A as well as the metal line 331A. The sub-via 300A is formed to come into contact with (and thus electrically coupled to) the sub-via 270. Hence, the metal line 331A is still electrically interconnected with the metal line 230.

FIGS. 10-13 are simplified top views of an interconnect structure. These Figures are provided to help illustrate how the implementation of the sub-vias (such as the sub-vias 270 and 300) may improve the fabrication process window. For example, as shown in the top view of FIG. 10, the interconnect structure 400 includes a plurality of metal lines 410 belonging to an $M_x$ interconnect layer, as well as a plurality of metal lines 420 belonging to an $M_{x+1}$ interconnect layer. The $M_{x+1}$ interconnect layer is disposed above the $M_x$ interconnect layer. The $M_{x+1}$ interconnect layer and $M_x$ interconnect layer are considered immediately adjacent interconnect layers, as no other interconnect layer is disposed between them. A plurality of traditional single vias 430 are disposed between the $M_x$ and $M_{x+1}$ interconnect layers and are configured to electrically interconnect respective metal lines 410 and 420 from these interconnect layers.

As discussed above, there may be situations where the single via 430 by itself may not be able to electrically interconnect the target metal lines 410 and 420, or at least not have sufficient connection areas. Therefore, the present disclosure can take an existing layout such as the one shown in FIG. 10 and decompose it to divide each single via 430 into multiple sub-vias. For example, FIG. 11A contains a top view layout of the vias 430. The metal lines 410 and 420 are not specifically illustrated in FIG. 11A for the sake of simplicity and clarity. FIG. 11A is decomposed into FIGS. 11B and 11C. FIG. 11B contains a top view layout of sub-vias 440 that are the bottom half sub-vias, i.e., these sub-vias 440 are similar to the sub-via 270 of FIGS. 1-9. Meanwhile, FIG. 11C contains a top view layout of sub-vias 450 that are the top half sub-vias, i.e., these sub-vias 450 are similar to the sub-via 300 of FIGS. 1-9.

Figure 10:
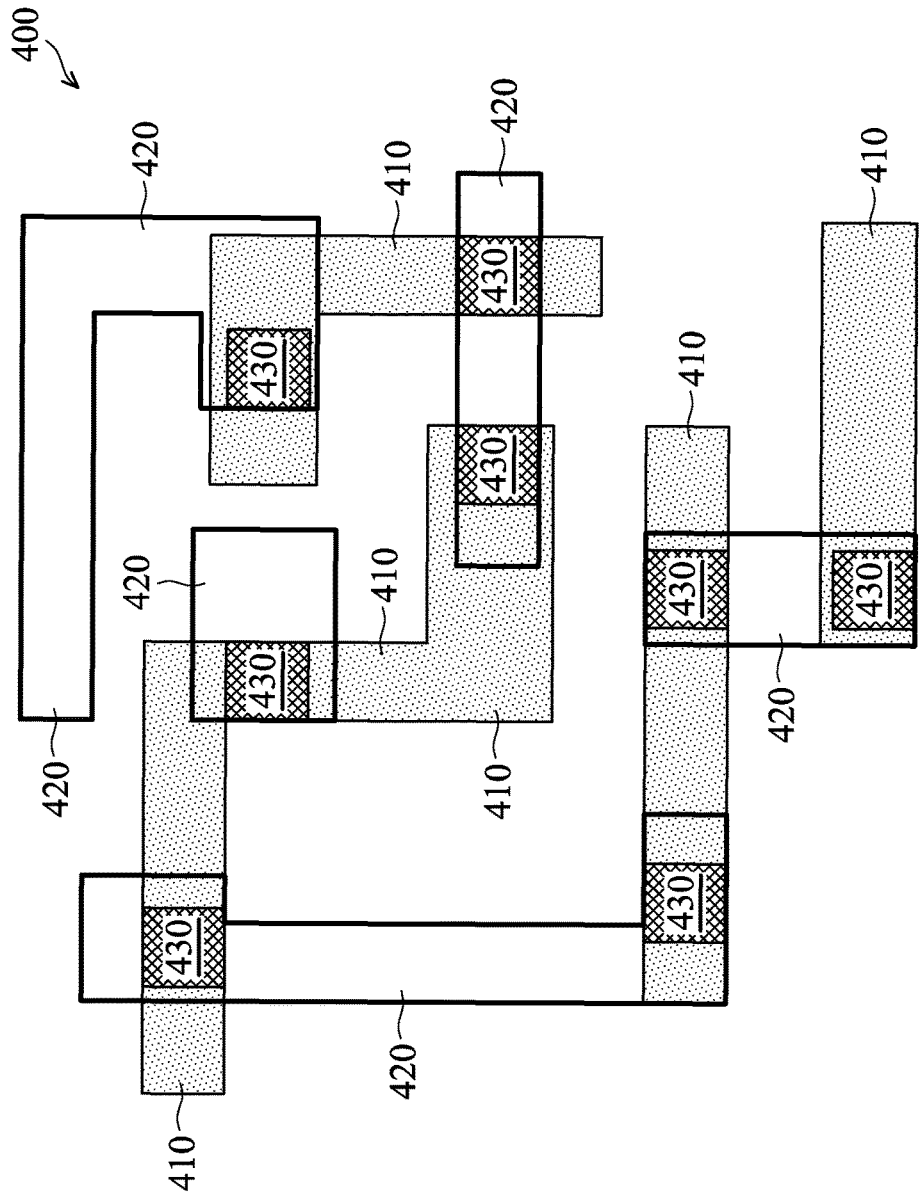

Now, the bottom sub-vias 440 only need to be concerned with making a sufficient electrical contact area with the target metal lines therebelow (i.e., the metal lines 410 of FIG. 10). The bottom sub-vias 440 need not be concerned with making an electrical contact area with the target metal lines thereabove (i.e., the metal lines 420 of FIG. 10), since the sub-vias 440 are not going to be contacting the metal lines 420 anyway. Similarly, the top sub-vias 450 only need to be concerned with making a sufficient electrical contact area with the target metal lines thereabove (i.e., the metal lines 420 of FIG. 10). The top sub-vias 450 need not be concerned with making an electrical contact area with the target metal lines therebelow (i.e., the metal lines 410 of FIG. 10), since the sub-vias 450 are not going to be contacting the metal lines 410 anyway. In comparison, the single via 430 would have been required to be concerned with contacting both the target metal lines 410 therebelow and the target metal lines 420 thereabove. In this manner, process window is improved by dividing the single vias 430 into two layers of sub-vias 440 and 450.

Referring now to FIGS. 12A-C, which are top views of photomasks used to form the single vias 430 and the sub-vias 440 and 450, respectively. In other words, photomasks containing patterns corresponding to the vias 430 and the sub-vias 440-450 may be used to pattern and form the vias and sub-vias 440-450 in a lithography process.

As discussed above, because the sub-vias 440 no longer need to touch the metal lines 420, and the sub-vias 450 no longer need to touch the metal lines 410, some aggressive approaches may be used to reshape or reconfigure the sub-vias 440-450. These aggressive approaches may not have been possible with the traditional single via 430. For example, the sub-vias 440 may be enlarged in either a horizontal direction or in a vertical direction, so as to enhance the electrical connection area. As another example, a plurality of printable assist features 460 may be deployed around the sub-vias 450, so that the eventual shape of the fabricated sub-vias 450 may be reconfigured in response to the assist features 460. In different embodiments, other resolution enhancement techniques (RET) may be employed to manipulate the geometries and location of the sub-vias 450

FIGS. 13A-13C are simplified top views of an interconnect structure that further illustrates advantages of the present disclosure. FIG. 13A is a top view that shows a portion of an interconnect structure 500 containing metal lines 510 and 520 that belong to different interconnect layers, respectively. The interconnect layers 510 and 520 are electrically interconnected together through a single via 530. However, this layout shown in FIG. 13A may violate design rules. For example, design rules may dictate that in a top view, the via must be completely surrounded by a metal line that it touches. In other words, the via must be disposed completely within a metal line that is in contact with the via. This may be known as an "enclosure constraint" rule. This particular design rule may be implemented to ensure that the via fabricated according to the layout will not cause defects. In other words, the "enclosure constraint" rule allows for enough process margin, so that even if process variations cause the via 530 to drift laterally, it will not completely miss the intended target metal line(s). Here, the disposition of the via 530 violates the "enclosure constraint" rule, because the via 530 is partially located outside the metal lines 510 and 520.

Applying the concepts of the present disclosure, the layout in FIG. 13A can be decomposed into the layouts in FIG. 13B and FIG. 13C. As discussed above, the deconstruction of the via 530 into the sub-vias 540 and 550 allows each sub-via to focus on making sufficient connection areas with only one target metal line, because each sub-via is configured to only connect to one metal line. Thus, the sub-vias 540 and 550 may be shifted or manipulated in various lateral directions, and the "enclosure constraint" design rule no longer needs to be followed. Accordingly, design and layout engineers can work out a more compact design in order to reduce overall chip area, which is a valuable resource that needs to be conserved.

Figure 14:
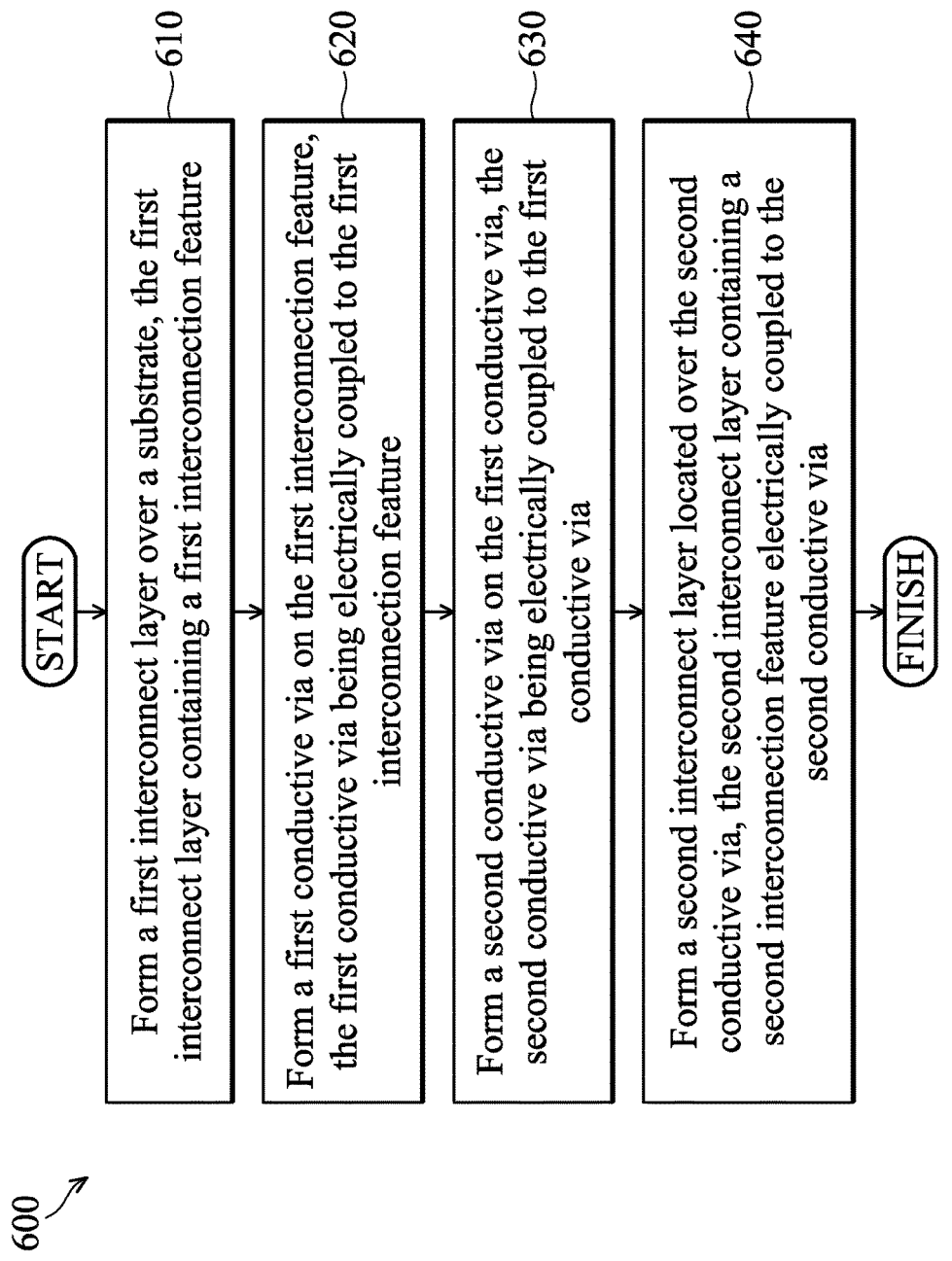
FIG. 14 is a flowchart illustrating a method of fabricating a semiconductor device according to various aspects of the present disclosure.

FIG. 14 is a flowchart of a method 600 for fabricating an interconnect structure of the present disclosure. The method 600 includes a step 610, in which a first interconnect layer is formed over a substrate. The first interconnect layer contains a first interconnection feature. The method 600 includes a step 620, in which a first conductive via is formed on the first interconnection feature. The first conductive via is electrically coupled to the first interconnection feature. The method 600 includes a step 630, in which a second conductive via is formed on the first conductive via. The second conductive via is electrically coupled to the first conductive via. The first conductive via and the second conductive via may be laterally offset from each other and may have different geometries. The method 600 includes a step 640, in which a second interconnect layer is formed over the second conductive via. The second interconnect layer contains a second interconnection feature electrically coupled to the second conductive via. The first interconnect layer and the second interconnect layer are adjacent interconnect layers with no other interconnect layers in between. The second conductive via and the second interconnection feature may be formed separately each through a single damascene process, or formed together through a dual damascene process.

Based on the discussions above, it can be seen that the various embodiments of the present disclosure offer advantages, it being understood that different embodiments may offer different advantages, and not all the advantages are discussed herein, and that no particular advantage is required for all embodiments. One of the other advantages of certain embodiments of the present disclosure is that, by decomposing a single via into two or more sub-vias, the aspect ratio of the sub-vias are easier to achieve, thereby making fabrication easier. The relaxed aspect ratios of the sub-vias also allow for greater connection areas, particularly for the bottom sub-via when it has a trapezoidal shape. The greater connection areas mean that it is easier for the via to form electrical connections with the intended metal line, and that the resistance at the connection area is reduced.

Another advantage is that, for those embodiments that allow the sub-vias to be horizontally shifted from each other (i.e., laterally offset), the non-alignment of the sub-vias may be used to perform interconnections with metal lines that have large amounts of offset with one another. Stated differently, a first sub-via may be placed closer to a first metal line, and a second sub-via may be placed closer to a second metal line. The first and second vias may still make contact with each other, and through that the first and second metal lines are still electrically coupled together. In comparison, a conventional single via would not have been able to electrically couple together both of the first and second metal lines.

Each sub-via can also be designed and configured individually to maximize its connection area with its respective metal line. In other words, since each sub-via is only making contact with one metal line, the process window is loosened, thereby reducing fabrication defects and increasing yield.

The reconfiguration of each sub-via may be done by reconstructing the shape and placement of the via, or by implementing assist features around the sub-via.

Yet another advantage of the present disclosure is that it may allow certain design rules to be bypassed. For example, the "enclosure constraint" design rule can now be bypassed, because it is no longer needed to ensure a sufficiently large connection area.

One of the broader forms of the present disclosure involves a semiconductor device. The semiconductor device includes: a first conductive component; a first via disposed over and electrically coupled to the first conductive component; a second via disposed over and electrically coupled to the first via, the second via being different from the first via; and a second conductive component disposed over and electrically coupled to the second via.

In some embodiments, the semiconductor device contains a substrate and an interconnect structure disposed over the substrate, and wherein the first conductive component, the second conductive component, the first via, and the second via are all located in the interconnect structure.

In some embodiments, the first conductive component is an interconnect line in a first interconnect layer of the interconnect structure; the second conductive component is an interconnect line in a second interconnect layer of the interconnect structure above the first interconnect layer; and no other interconnect layer is located between the first interconnect layer and the second interconnect layer.

In some embodiments, the first via and the second via are misaligned with respect to one another.

In some embodiments, the first via and the second via are shaped differently.

In some embodiments, the first via and the second via each have an approximately trapezoidal shape.

In some embodiments, the semiconductor device further includes: an etch-stop layer disposed near an interface between the first via and the second via.

In some embodiments, at least one of the following is true: the first via extends beyond boundaries of the first conductive component from a top view; and the second via extends beyond boundaries of the second conductive component from a top view.

Another of the broader forms of the present disclosure involves a semiconductor interconnect structure. The semiconductor interconnect structure includes: a first metal layer containing a first metal line; a dielectric layer located over the first metal layer, the dielectric layer containing a first sub-via electrically coupled to the first metal line and a second sub-via electrically coupled to the first sub-via, the second sub-via being different from the first sub-via; and a second metal layer located over the dielectric layer, the second metal layer containing a second metal line electrically coupled to the second sub-via, wherein no other metal layer is located between the first metal layer and the second metal layer.

In some embodiments, the semiconductor interconnect structure is located over a substrate containing microelectronic components, and wherein the interconnect structure is configured to provide electrical access to at least some of the microelectronic components.

In some embodiments, the first sub-via and the second sub-via are positionally shifted from one another.

In some embodiments, the first sub-via and the second sub-via have different geometries.

In some embodiments, semiconductor interconnect structure further includes: an etch-stop layer located near and circumferentially surrounding an interface between the first sub-via and the second sub-via.

In some embodiments, from a top view perspective, the first sub-via is free of being enclosed by the first metal line, or the second sub-via is free of being enclosed by the second metal line.

Still another of the broader forms of the present disclosure involves a method of fabricating a semiconductor device. The method includes: forming a first interconnect layer over a substrate, the first interconnect layer containing a first interconnection feature; forming a first conductive via over the first interconnection feature, the first conductive via being electrically coupled to the first interconnection feature; forming a second conductive via over the first conductive via, the second conductive via being electrically coupled to the first conductive via; and forming a second interconnect layer over the second conductive via, the second interconnect layer containing a second interconnection feature electrically coupled to the second conductive via.

In some embodiments, the second conductive via and the second interconnection feature are formed separately each through a single damascene process.

In some embodiments, the second conductive via and the second interconnection feature are formed together through a dual damascene process.

In some embodiments, the forming the first conductive via and the forming the second conductive via are performed such that the first conductive via and the second conductive via are laterally offset from each other.

In some embodiments, the forming the first conductive via and the forming the second conductive via are performed such that the first conductive via and the second conductive via have different geometries.

In some embodiments, the first interconnect layer and the second interconnect layer are adjacent interconnect layers with no other interconnect layers in between.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a first conductive line feature having a topmost surface, wherein the first conductive line feature is formed in a first dielectric layer disposed on a semiconductor substrate having a plurality of microelectronic components formed in the semiconductor substrate;
a first via conductor disposed over the first conductive line feature,
wherein a first portion of a bottom surface of the first via conductor interfaces a portion of the topmost surface of the first conductive line feature and a second portion of the bottom surface of the first via conductor interfaces the first dielectric layer;
a second via conductor disposed over the first via conductor and the second via conductor having a bottom surface, wherein a first portion of the bottom surface of the second via conductor interfaces a top surface of the first via conductor and a second portion of the second via conductor interfaces a second dielectric layer adjacent the first via conductor; and a second conductive line feature disposed over and interfacing a top surface of the second via conductor,
wherein the second conductive line feature has a bottommost surface with a first portion interfaces a first portion of a top surface of the second via conductor, wherein a second portion of the top surface of the second via conductor interfaces a third dielectric layer, the third dielectric layer over the second dielectric layer, and wherein the first portion of the top surface of the second via conductor is coplanar with the second portion of the top surface of the second via conductor; and wherein the first conductive line feature and the second conductive line feature are offset such that the topmost surface of the first conductive line feature is not directly underneath the bottommost surface of the second conductive line feature;

wherein the interface of the first portion of the top surface of the second via conductor and the bottommost surface of the second conductive line feature has a first length, and the interface between the first portion of the bottom surface of the first via conductor and the portion of the topmost surface of the first conductive line feature has a second length, the first length greater than the second length; and the first conductive line feature is in a first interconnect layer denoted Mx of an interconnect structure of the semiconductor device;

the second conductive line feature is in a second interconnect layer of the interconnect structure of the semiconductor device above the first interconnect layer denoted Mx+1, wherein x is equal to an whole number equal to 1; and wherein the first conductive line feature, the first via conductor, the second via conductor and the second conductive line feature provide electrical routing between the microelectronic components of the semiconductor substrate.

2. The semiconductor device of claim 1, wherein the first via conductor and the second via conductor are offset such that a portion of a bottommost surface of the second via conductor is free from contact by a topmost surface of the first via conductor.

3. The semiconductor device of claim 1, wherein the first via conductor and the second via conductor are shaped differently.

4. The semiconductor device of claim 1, wherein the first via conductor and the second via conductor each have an approximately trapezoidal shape.

5. The semiconductor device of claim 1, further comprising: an etch-stop layer disposed near an interface between the first via conductor and the second via conductor.

6. The semiconductor device of claim 1, wherein the top surface of the first via conductor includes a second portion interfacing an etch stop layer disposed between the second dielectric layer and the third dielectric layer.

7. The semiconductor device of claim 1, wherein the first dielectric layer extends to a top surface of the semiconductor substrate.

8. The semiconductor device of claim 7, wherein the first dielectric layer includes a plurality of dielectric compositions.

9. A semiconductor structure, comprising:
a semiconductor substrate having an interconnect structure disposed thereon, the interconnect structure providing interconnections between features formed in the semiconductor substrate, the interconnect structure including:
a first interconnect layer containing a first metal line in a first dielectric layer and extending parallel to a top surface of the semiconductor substrate providing electrical routing in a horizontal direction;
a second dielectric layer located over the first metal line and the first dielectric layer;
a first sub-via conductor having a planar first bottommost surface, the planar first bottommost surface having a first portion interfacing to a topmost surface of the first metal line and a second portion of the planar first bottommost surface interfacing the first dielectric layer;
a second sub-via conductor having a planar second bottommost surface, a first portion of the planar second bottommost surface interfacing to the first sub-via conductor and a second portion of the planar second bottommost surface interfacing the second dielectric layer, the second sub-via conductor being different from the first sub-via conductor, wherein the first sub-via conductor is positioned above the first metal line and the second sub-via conductor is positioned above the first sub-via conductor; and
a second interconnect layer located over the second dielectric layer and containing a second metal line extending parallel to the top surface of the semiconductor substrate and providing routing in the horizontal direction and interfacing the second sub-via conductor, wherein a first portion of a planar topmost surface of the second sub-via conductor interfaces a first portion of a bottommost surface of the second metal line, and a second portion of the planar topmost surface of the second sub-via conductor interfaces a third dielectric layer, wherein a first length of the first portion of the planar topmost surface of the second sub-via conductor is greater than a second length of the first portion of the planar first bottommost surface of the first sub-via conductor that interfaces the topmost surface of the first metal line;
wherein the second interconnect layer is an adjacent interconnect layer to the first interconnect layer; and
wherein a topmost surface of the first metal line is not directly underneath the bottommost surface of the second metal line.

10. The semiconductor structure of claim 9, wherein the first sub-via conductor and the second sub-via conductor have different geometries.

11. The semiconductor structure of claim 9, further comprising: an etch-stop layer located near and circumferentially surrounding an interface between the first sub-via conductor and the second sub-via conductor.

12. The semiconductor structure of claim 9, wherein: from a top view perspective, the first sub-via conductor is free of being enclosed by the first metal line, or the second sub-via conductor is free of being enclosed by the second metal line.

13. The semiconductor structure of claim 9, wherein the features formed in the semiconductor substrate include doped features.

14. A semiconductor device, comprising:
a first conductive component disposed in a first dielectric material over a semiconductor substrate, wherein the first conductive component is a first metal line providing a horizontal routing of an electrical signal;

a first via conductor in a third dielectric material and disposed over the first conductive component, wherein a first portion of a bottom surface of the first via conductor interfaces a first portion of a topmost surface of the first conductive component, wherein a second portion of the bottom surface of the first via conductor interfaces the first dielectric material, wherein the first portion and the second portion of the bottom surface of the first via conductor are coplanar; and wherein a second portion of the topmost surface of the first conductive component interfaces a second dielectric material disposed over the first dielectric material and under the third dielectric material, wherein the second dielectric material has a different composition than the first dielectric material and the third dielectric material and the first portion of the topmost surface of the first conductive component is coplanar with the second portion of the topmost surface of the first conductive component;

a second via conductor disposed in a fifth dielectric material over the third dielectric material wherein the second via conductor is electrically coupled to the first via conductor, wherein a first portion of a top surface of the first via conductor interfaces a first portion of a bottom surface of the second via conductor, wherein a second portion of the top surface of the first via conductor interfaces a fourth dielectric material under the fifth dielectric material and over the third dielectric material, wherein the first portion of the top surface of the first via conductor and the second portion of the top surface of the first via conductor are coplanar; and wherein a second portion of the bottom surface of the second via conductor interfaces the third dielectric material, wherein the first portion of the bottom surface of the second via conductor is coplanar with the second portion of the bottom surface of the second via conductor; and wherein the first and second via conductors provide a vertical routing of the electrical signal between the first conductive component and a second conductive component;

the second conductive component disposed in a seventh dielectric material over and electrically coupled to the first conductive component wherein the second conductive component is electrically coupled to the first conductive component by the first via conductor and the second via conductor, wherein the second conductive component is a second metal line providing a horizontal routing of the electrical signal;

wherein a first portion of a top surface of the second via conductor interfaces a first portion of a bottommost surface of the second conductive component, wherein a second portion of the top surface of the second via conductor interfaces a sixth dielectric material, the sixth dielectric material interposing the fifth dielectric material and the seventh dielectric material and having a different composition than each of the fifth dielectric material and the seventh dielectric material, the first portion of the top surface of the second via conductor is coplanar with the second portion of the top surface of the second via conductor; and wherein a second portion of the bottommost surface of the second conductive component interfaces the fifth dielectric material, wherein the first and second conductive components are in next adjacent interconnect layers, and wherein the first conductive component and the second conductive component are offset such that the first portion of the bottommost surface of the second conductive component is not vertically aligned with the first portion of the topmost surface of the first conductive component.

15. The semiconductor device of claim 14, wherein the first via conductor and the second via conductor are shaped differently.

16. The semiconductor device of claim 14, wherein the first via conductor and the second via conductor each have an approximately trapezoidal shape.

17. The semiconductor device of claim 14, wherein the first dielectric material directly interfaces the second dielectric material layer, the second dielectric material directly interfaces the third dielectric material, the third dielectric material directly interfaces the fourth dielectric material, the fourth dielectric material directly interfaces the fifth dielectric material, and the fifth dielectric material directly interfaces the sixth dielectric material.

18. The semiconductor device of claim 14, wherein the second dielectric material has a different composition from each of the first, third and fifth dielectric materials.

19. The semiconductor device of claim 14, wherein the first via conductor and the second via conductor are tungsten and the first and second metal lines are copper.

20. The semiconductor device of claim 14, wherein the first metal line provides the horizontal routing in a first direction and the second metal line provides the horizontal routing in a second direction perpendicular to the first direction.

* * * * *